United States Patent
Wang et al.

(10) Patent No.: US 9,029,062 B2
(45) Date of Patent: May 12, 2015

(54) PHOTORESIST AND PATTERNING PROCESS

(75) Inventors: Chien-Wei Wang, Wufong Township (TW); Chun-Ching Huang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 462 days.

(21) Appl. No.: 12/827,635

(22) Filed: Jun. 30, 2010

(65) Prior Publication Data

US 2012/0003582 A1 Jan. 5, 2012

(51) Int. Cl.
| | |
|---|---|
| G03F 7/004 | (2006.01) |
| G03F 7/039 | (2006.01) |
| G03F 7/20 | (2006.01) |
| G03F 7/30 | (2006.01) |
| G03F 7/28 | (2006.01) |
| G03F 7/038 | (2006.01) |
| G03F 7/09 | (2006.01) |

(52) U.S. Cl.
CPC ............ *G03F 7/0045* (2013.01); *G03F 7/0382* (2013.01); *G03F 7/0392* (2013.01); *G03F 7/091* (2013.01)

(58) Field of Classification Search
None
See application file for complete search history.

(56) References Cited

U.S. PATENT DOCUMENTS

| | | | | |
|---|---|---|---|---|
| 6,258,732 | B1 * | 7/2001 | Lin et al. | 438/780 |
| 2002/0012875 | A1 * | 1/2002 | Pavelchek et al. | 430/270.1 |
| 2003/0129531 | A1 * | 7/2003 | Oberlander et al. | 430/271.1 |
| 2004/0004787 | A1 * | 1/2004 | Matono et al. | 360/126 |
| 2007/0269744 | A1 * | 11/2007 | Hada et al. | 430/286.1 |
| 2008/0153030 | A1 * | 6/2008 | Kobayashi et al. | 430/270.1 |
| 2011/0151377 | A1 * | 6/2011 | Gray et al. | 430/270.1 |

FOREIGN PATENT DOCUMENTS

| | | |
|---|---|---|
| CN | 1608230 | 4/2005 |
| CN | 1615302 | 5/2005 |
| CN | 1989455 | 6/2007 |

OTHER PUBLICATIONS

Office Action dated Jun. 18, 2014 from corresponding No. CN 201110025180.5.

* cited by examiner

*Primary Examiner* — Sin J. Lee
(74) *Attorney, Agent, or Firm* — Lowe Hauptman & Ham, LLP

(57) ABSTRACT

A method and photoresist material for the patterning of integrated circuit (IC) components using ultra violet (UV) and extreme ultraviolet lithography (EUV) that includes providing a substrate, forming a first material layer over the substrate, forming a second material layer over the first material layer, the second material layer having a luminescent agent, and exposing one or more portions of the second material layer.

20 Claims, 3 Drawing Sheets

PHOTORESIST AND PATTERNING PROCESS

TECHNICAL FIELD

The present disclosure relates to patterning of integrated circuit (IC) components using ultra violet (UV) and extreme ultraviolet lithography (EUV).

BACKGROUND

The wavelength of the UV light being applied to the photoresist coating during the photolithography step of the semiconductor manufacturing process limits the ability to decrease the geometric size of the IC components. Indeed, the optical contrast, which determines the size of the IC component, is directly proportional to the wavelength of the UV light being projected onto the photoresist coating.

Conventionally, photolithography has used UV lights generated from lights containing krypton fluoride (KrF) and argon fluoride (ArF). These chemicals produce UV lights with wavelengths ranging from 193 nm to 248 nm. In such conventional KrF/ArF photolithography processes, the photoresist coating comprises an acid deprotectable or crosslinkable polymer, a photoacid generator (PAG), and a base quencher. In a KrF/ArF photolithography process, when the KrF/ArF UV light strikes the surface of the photoresist coating, the PAG absorbs the electromagnetic waves of the UV light and generates acid. Thereafter, the acid reacts with the photoresist polymer; changing chemical property of the photoresist polymer to make it soluble for the ensuing developing step. However, as the sizes of IC components became smaller, the ArF/KrF lithography processes became obsolete due to the relative long wavelengths of the ArF/KrF UV lights.

Accordingly, a photolithography method that uses UV lights with much shorter wavelengths was developed. Specifically, the EUV lithography uses UV lights that contain electromagnetic waves with wavelengths of about 13.5 nm. However, PAGs cannot absorb such low-wavelength UV lights. One aspect of the EUV photolithography processes is the inclusion of a photosensitizer to the photoresist coating. When the EUV light strikes the photoresist coating, the photosensitizer absorbs the short-wavelength electromagnetic waves and releases photoelectrons. These photoelectrons then react with PAGs to generate acid. Thereafter, the acid reacts with the photoresist polymers changing the chemical properties of the photoresist polymers, much like the conventional KrF/ArF photolithography process.

However, while the EUV photolithography uses short-wavelength UV lights to create smaller IC components, it has some drawbacks. First, the EUV photolithography is inefficient—the photosensitizers and PAGs in the photoresist coating typically convert only 5 percent of the short-wavelength electromagnetic waves into acid. Moreover, the photoelectrons generated within the photoresist coating dissipate energy as heat. This excess amount of heat may cause photoresist outgassing.

Accordingly, what is needed is a method and photoresist material for manufacturing an integrated circuit device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
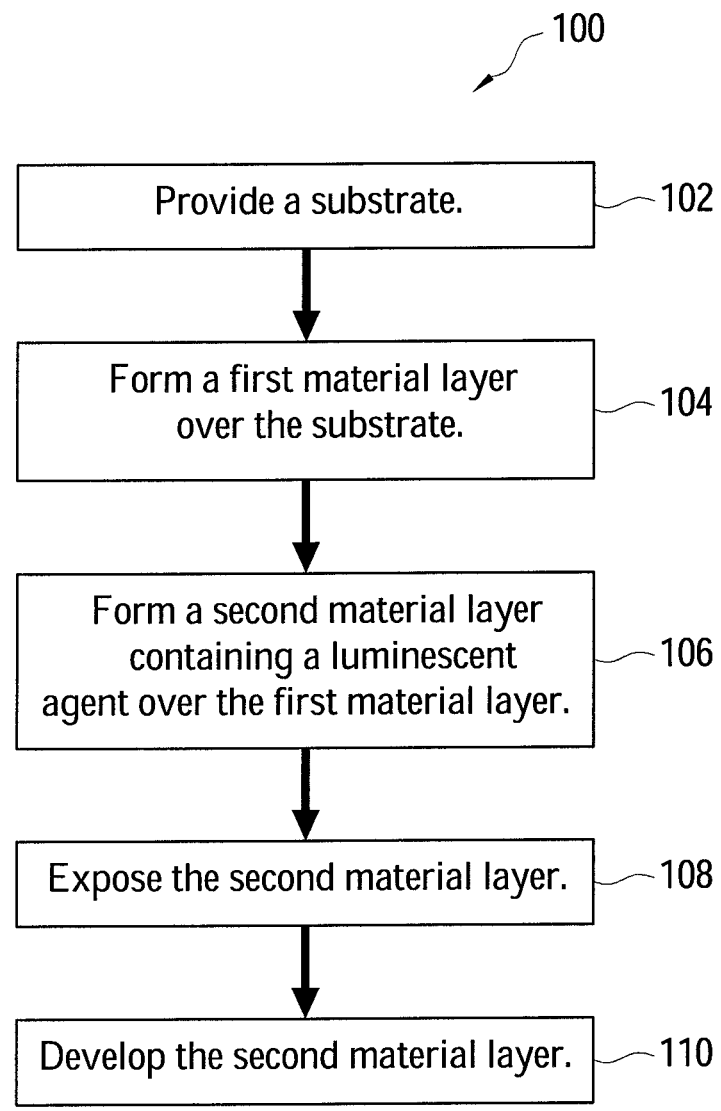
FIG. 1 is a flow chart of a method for fabricating a semiconductor device according to aspects of the present embodiments.

The present disclosure relates generally to methods for manufacturing semiconductor devices, and more particularly, to a method and photoresist for patterning various semiconductor device features.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
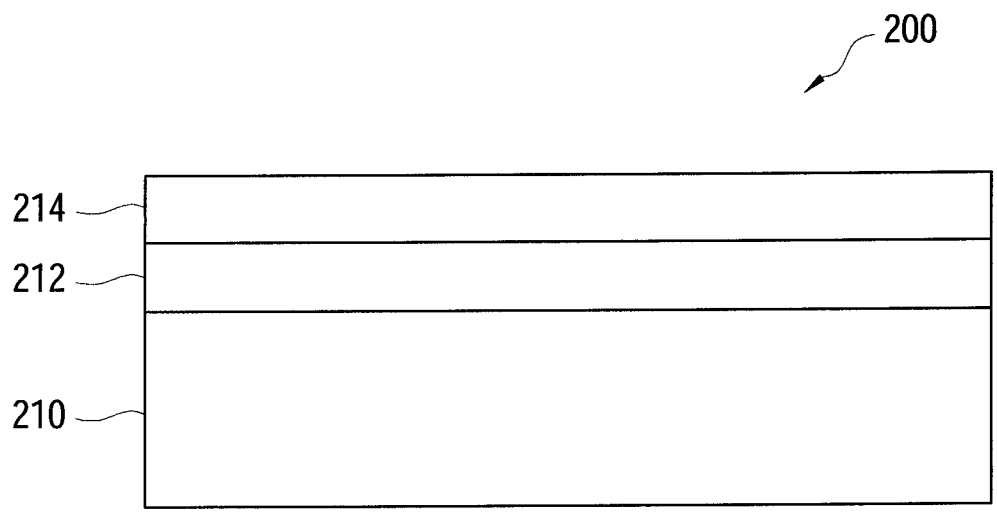
FIGS. 2A-2C are various cross-sectional views of embodiments of a semiconductor device during various fabrication stages according to the method of FIG. 1.
Figure 2B:
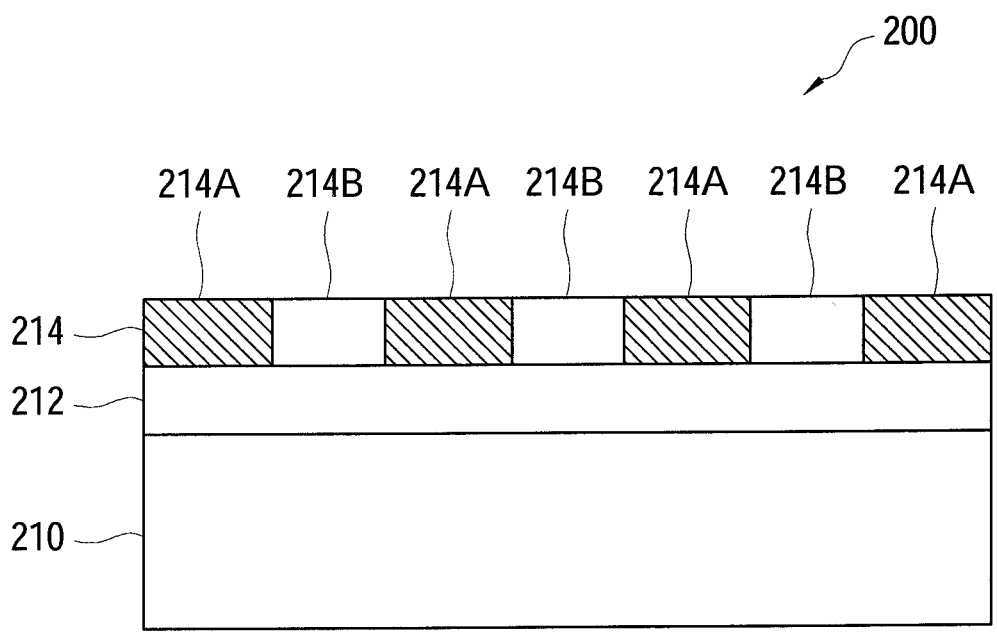
Figure 2C:
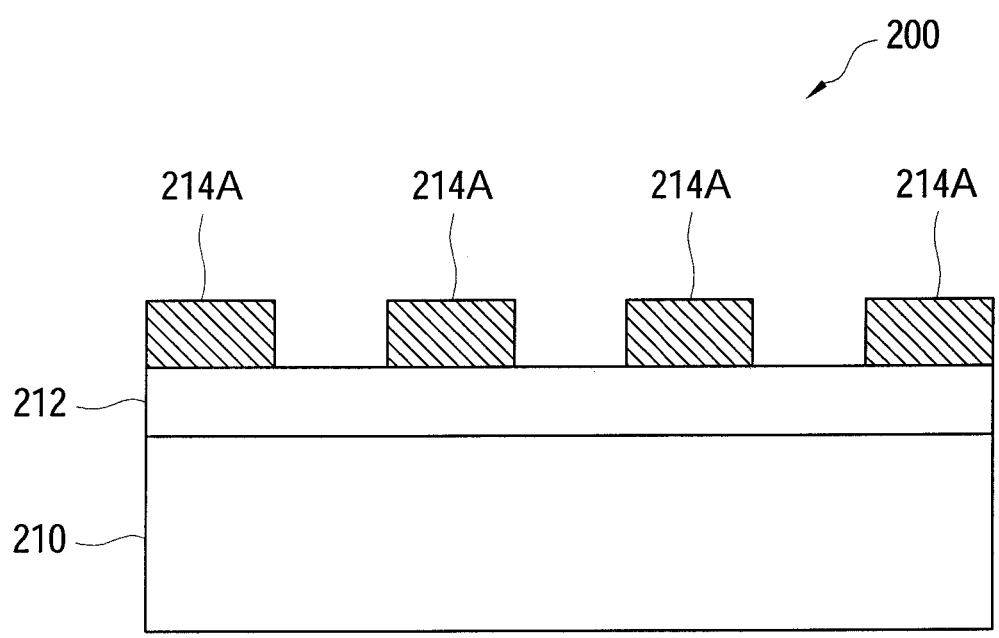

With reference to FIG. 1 and FIGS. 2A-2C, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. FIG. 1 is a flow chart of one embodiment of the method 100 for making the semiconductor device 200. FIGS. 2A-2C are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The method 100 is a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes, such as a pre-exposure bake or a post-exposure bake, may be performed before or after exposing the substrate. A developing process selectively removes the exposed or unexposed regions to a developing solution creating an exposure pattern over the substrate. A series of chemical treatments then engrave the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

Referring to FIGS. 1 and 2A, the method 100 begins at block 102 wherein a substrate 210 is provided. The substrate 210 can be an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epitaxial layer. In other embodiments, the silicon substrate may include a multilayer compound semiconductor structure. Alternatively, the substrate 210 includes a non-semiconductor material, such as a glass substrate for thin-film-transistor liquid crystal display (TFT-LCD) devices, or fused quartz or calcium fluoride for a photomask (mask).

The substrate 210 may comprise a material layer. The material layer can be high-k dielectric layers, gate layers, hard mask layers, interfacial layers, capping layers, diffusion/barrier layers, dielectric layers, conductive layers, other suitable layers, or combinations thereof. A high-k dielectric layer can include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, other suitable high-k dielectric materials, or combinations thereof. A gate layer can include silicon-containing materials; germanium-containing materials; metal, such as aluminum, copper, tungsten, titanium, tantalum, titanium nitride (TiN), tantalum nitride (TaN), nickel silicide ($Ni_2Si$), cobalt silicide ($CoSi_2$), tantalum carbide (TaC), tantalum silicon nitride (TaSiN), and/or tantalum carbide nitride (TaCN); other suitable materials; and/or combinations thereof. In an embodiment, the gate layer comprises a layer of silicon dioxide and a layer of high-k dielectric material. The gate layer may be doped polycrystalline silicon with the same or different doping. The gate layer may comprise a work function layer. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the work function layer may include doped-conducting metal oxide materials.

At blocks 104 and 106, a first material layer 212 and a second material layer 214 are formed over the substrate 210. Alternatively, the first material layer 212 may be eliminated and the second material layer 214 may be formed over the substrate 210. The first material layer 212 comprises a different composition than the second material layer 214. The first and second material layers 212, 214 are coated on the substrate 210 to any suitable thickness by any suitable process, such as spin-on coating, chemical vapor deposition (CVD), plasma enhanced chemical vapor deposition (PECVD), atomic layer deposition (ALD), physical vapor deposition (PVD), high density plasma CVD (HDPCVD), other suitable methods, and/or combinations thereof. The first material layer 212 has different optical properties than the second material layer 214. For example, the first material layer 212 has substantially different refractive indexes (i.e., n values) and extinction coefficients (i.e., k values) than the second material layer 214. The first and second material layers 212, 214 may further have different etching resistances.

The first material layer 212 is a patterning layer. The patterning layer comprises photoresist layers, antireflective coating layers (e.g., a top antireflective coating layer (TARC) and/or a bottom antireflective coating layer (BARC)), high-k dielectric layers, gate layers, hard mask layers, interfacial layers, capping layers, diffusion/barrier layers, dielectric layers, conductive layers, other suitable layers, and/or combinations thereof. The patterning layer may be similar to those described above. An exemplary first material layer 212 comprises silicon, silicon dioxide, silicon nitride, silicon carbide, silicon oxynitride, metal, metal alloy, metal oxide (e.g., $Al_2O_3$, hafnium oxide), metal nitride (e.g., TiN), metal oxynitride, siloxane, other suitable materials, and/or combinations thereof. Alternatively, the first material layer 212 comprises a BARC coating material, such as an organic BARC material. In yet another embodiment, the first material layer 212 comprises at least one of an acid labile molecule, photoacid generator (PAG), quencher, chromophore, crosslinker, surfactant, and/or solvent.

The second material layer 214 is a photoresist layer. The photoresist layer is a positive-type or negative-type resist material and may be a composite layer. One exemplary resist material is a chemical amplifying (CA) resist. The second material layer 214 contains at least one of a polymer, a PAG, a quencher (base), a chromophore, and/or a solvent. The polymer comprises an organic or inorganic polymer. The molecular weight of the polymer is between approximately 2,000 and 20,000. The polymer may include an acid cleavable polymer, an acid catalyzed crosslinkable polymer, a polymeric pinacol, and/or other suitable polymer. The amount of PAG used is in the range from about 5% by weight to about 20% by weight of a polymer present in the second material layer 214. The second material layer 214 may further comprise a surfactant, a photodegradable base, an electron acceptor, and/or crosslinker. The electron acceptor can comprise at least one of the following: ketone, aldehyde, carboxylic acid, ester, amide, carbon dioxide, haloalkane, haloalkene, haloalkyne, alkene, alkyne, aromatic rings, other suitable groups, and/or combinations thereof.

Conventional photoresist layers do not contain luminescent agents. In the various embodiments of the present disclosure, however, a luminescent agent is added to the photoresist coating material 214. When a first electromagnetic wave with wavelength shorter than 150 nm (e.g., 0.01 nm~50 nm), such as that used in the EUV lithography, propagates into the surface of the photoresist layer, the luminescent agent absorbs that electromagnetic wave. The luminescent agent then releases a second electromagnetic wave with a wavelength longer than the first one (e.g., 151 nm~750 nm). In essence, the luminescent agent converts a short-wavelength electromagnetic wave into a PAG-absorbable, long-wavelength UV-Vis light. The luminescent agent typically converts the first electromagnetic wave at the rate of around 10 to 90 percent. After the conversion process, the long-wavelength UV-Vis light excites the PAG in the photoresist coating and generate acid. The ratio of generated acid and the photons within in the first electromagnetic wave is defined as the acid generation efficiency. The acid then reacts with the photoresist polymers to alter their chemical properties in preparation for the developing step. In the present embodiment, the luminescent agent loading-amount is from about 0.001% by weight to about 10% by weight of the photoresist polymer. Additionally, in the present embodiment, the luminescent agent loading-amount is less than the photoacid generator loading amount.

The inclusion of a luminescent agent into the photoresist coating has certain advantages. Like the photoresist coating used in the EUV lithography, photoresist coating with luminescent agent is capable of absorbing the short-wavelength EUV light. On the other hand, unlike the photoresist coating used in the EUV lithography, the photoresist coating with luminescent agent has a much higher acid generation efficiency because it does not use photosensitizers to convert the short-wavelength EUV light into photoelectrons as discussed above. Moreover, the photoresist coating with luminescent agent does not generate excessive amount of heat, which is one of the major drawbacks of EUV lithography.

Examples of the luminescent agent include at least one of an organic molecule with aromatic ring, an ionic salt, a metal alloy, other suitable materials, and/or combinations thereof. An exemplary organic molecule with aromatic ring is represented by the formula:

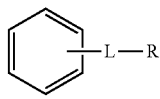

L represents a linking group including —CO—, —C(=O)O—, —S—, —P—, —P(O$_2$)—, —C(=O)S—, —O—, —N—, —C(=O)N—, —SO$_2$O, —SO$_2$S—, —SO—, —SO$_2$—, and R*. R and R* can be an alkyl group, an alkenyl group, an alkynyl group, an aromatic group, —Cl, —Br, —I, —NO$_2$, —SO$_3$—, —H—, —CN, —NCO, —OCN, —CO$_2$—, —OH, —OR', —OC(O)CR', —SR', —SO$_2$N (R')$_2$, —SO$_2$R', SOR', —OC(O)R', —C(O)OR', —C(O)R', —Si(OR')$_3$, —Si(R')$_3$, or epoxyl; where R' can be H, alkyl, alkenyl, or alkynyl groups.

An exemplary ionic salt has the general formula MaXb, where "M" is a metal cation such as an ammonia cation or phosphorous, and "X" is anion such as sulfonate, nitrate, nitrite carboxylate, phosphate. "a" is a number in the range of between about 0.5 and 1.5 and "b" is a number in the range of between about 0.5 and 3.

An exemplary metal alloy has the general formula McYd, where "M" and "Y" are metals such as sodium, potassium, iron, copper, or nickel. "c" is a number ranges from about 0.1 to 1 and "d" is a number ranges from about 0.8 to 2.

At block 108, at least one exposure process is performed on the second material layer 214. The exposure process selectively illuminates the second material layer 214 by a radiation beam to form one or more exposed portions 214A and unexposed portions 214B as illustrated in FIG. 2B. The patterned exposed and unexposed portions 214A, 214B are formed by illuminating the second material layer with a radiation source through one or more photomasks (or reticles) to form an image pattern. The radiation beam used to expose the second material layer 214 may be ultraviolet and/or extended to include other radiation beams, such as ion beam, x-ray, extreme ultraviolet, deep ultraviolet, and other forms of radiation. In an embodiment, the second material layer 214 is exposed to a wavelength substantially less than 250 nm. The lithography process may implement krypton fluoride (KrF) excimer lasers, argon fluoride (ArF) excimer lasers, ArF immersion lithography, ultraviolet (UV) radiation, extreme ultra-violet (EUV) radiation, and/or electron-beam writing (e-beam). The exposing process may also be implemented or replaced by other proper methods such as maskless photolithography, ion-beam writing, and/or molecular imprint techniques. It is understood that a single exposure patterning process, double exposure patterning process, or multiple exposure patterning process may be performed. For example, the second material layer 214 can be exposed to a first wavelength, and then, subsequently exposed to a second wavelength. The second wavelength can be similar to the first wavelength, i.e., both wavelengths are substantially less than 250 nm and can be as low as 13.5 nm. The second wavelength may be substantially different than the first wavelength.

Subsequently, the second material layer 214 may be subjected to a post-exposure bake (PEB) process. After a pattern exposure and/or post-exposure bake (PEB) process, the PAG in the second material layer 214 (i.e., photoresist) may produce an acid and thus increase or decrease its solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer or cause a polymeric pinnacle to undergo pincaol rearrangement, resulting in the polymer becoming more hydrophobic).

As noted above, when formed, the second material layer 214 is tuned to include photobase generators exhibiting characteristics for diffusion control or loading control, such as the photobase generators described herein. Such tuning provides better control over the overall acid and base distribution that occurs during an exposure process. The base distribution may be modified to enhance the final acid distribution, which provides improved acid/base distribution contrast, resulting in an improved pattern profile. The modified base distribution particularly improves resolution (contrast) of the resulting pattern.

At block 110, the second material layer 214 is developed to form a pattern in the second material layer 214 by any suitable process as illustrated in FIG. 2C. A developing solution may be utilized to remove portions of the second material layer 214, such as tetramethylammonium hydroxide (TMAH). Any concentration level of TMAH developer solution may be utilized, such as approximately 2.38% TMAH developer solution. The developing solution may remove the exposed or unexposed portions 214A, 214B depending on the resist type. For example, in the present embodiment, the second material layer 214 comprises a negative-type resist, so the exposed portions 214A are not dissolved by the developing solution and remain over the first material layer 212 (or substrate 210). If the second material layer 214 comprises a positive-type resist, the exposed portions 214A would be dissolved by the developing solution, leaving the unexposed portions 214B.

The remaining exposed portions 214A (or unexposed portions 214B) define a pattern. The pattern contains one or more openings, wherein portions of the underlying first material layer 212 (or substrate 210) are exposed. It is understood that subsequent processing may include removing the exposed portions of the first material layer 212 and/or substrate 210 within the openings. Alternatively, metal deposition, ion implantation, or other processes can be carried out over/on the first material layer 212 and/or substrate 210. The patterned second material layer 214 may then be removed or stripped and subsequent processing may continue.

In summary, the disclosed embodiments provide a method for fabricating an integrated circuit device utilizing a photoresist layer having a luminescent agent. The luminescent agent comprises at least one of an aromatic chemical, an ionic salt, a metal alloy and/or combinations thereof. The luminescent agent absorbs a first electromagnetic wave and emits a second electromagnetic wave, resulting ultimately in improved profile contrast (or resolution). The disclosed embodiments may provide one or more advantages, such as improved lithography resolution and patterning profiles. Also, the disclosed method and photoresist material provide reduced iso/dense bias. It is understood that different embodiments may have different advantages, and that no particular advantage is necessarily required of all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist material comprising:
a polymer;
a photoacid generator configured to generate acid that reacts with the polymer;
a quencher base;
a chromophore;
a solvent; and
a luminescent agent, different from the photoacid generator, that converts a first wavelength electromagnetic wave into a second wavelength electromagnetic wave, the second wavelength electromagnetic wave being capable of causing the photoacid generator to generate acid
wherein the luminescent agent comprises an ionic salt represented by the formula MaXb,
where M is a cation,
X is n anion,
a is a number from about 0.5 to about 1.5, and
b is a number from about 0.5 to about 3,
and the luminescent agent further comprises a metal alloy represented by the formula McYd,
wherein M and Y are metals, at least one of M or Y comprises sodium or potassium, and c is a number from about 0.1 to about 1, and d is a number from about 0.8 to about 2.

2. The photoresist material of claim 1 wherein the luminescent agent further comprises an aromatic chemical represented by the formula:

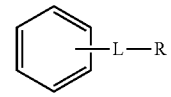

wherein L is a linking group, and R is selected from the group consisting of an alkyl group, an alkenyl group, an alkynyl group, an aromatic group, an epoxyl group, —Cl, —Br, —I, —NO$_2$, —H, —CN, —NCO, —OCN, —OH, —OR', —SR, —SO$_2$N(R')$_2$, —SO$_2$R', SOR', —OC(O)R', —C(O)OR', —C(O)R', —Si(OR')$_3$ and —Si(R')$_3$, where R' is selected from the group consisting of hydrogen, an alkyl group, an alkenyl group, and an alkynyl group.

3. The photoresist material of claim 2 wherein the linking group is selected from the group consisting of —CO—, —C(=O)O—, —S—, —P—, —P(O$_2$)—, —C(=O)S—, —O—, —N—, —C(=O)N—, —SO$_2$O—, —SO$_2$S—, —SO—, —SO$_2$— and R*, where R* is selected from the group consisting of an alkylene group, an alkenylene group, an alkynylene group, an aromatic group, an epoxyl group, —SO$_3$—, —CO$_2$—, —OR', —SR, —SO$_2$R', SOR', —OC(O)R', —C(O)OR', and —C(O)R'.

4. The photoresist material of claim 3 wherein the linking group is R*.

5. The photoresist material of claim 2, wherein R is selected from the group consisting of —OR', —SR, —SO$_2$N(R')$_2$, —SO$_2$R', SOR', —OC(O)R', —C(O)OR', —C(O)R', —Si(OR')$_3$ and —Si(R')$_3$ and R' is selected from the group consisting of hydrogen, an alkyl group, an alkenyl group, and an alkynyl group.

6. The photoresist material of claim 1, wherein the cation is selected from the group consisting of ammonium, phosphorous, and a hydronium cation.

7. The photoresist material of claim 1, wherein the anion is selected from the group consisting of sulfonate, nitrate, nitrite, carboxylate and phosphate.

8. The photoresist material of claim 1 wherein the luminescent agent loading amount is from about 0.001% by weight to about 10% by weight of the polymer.

9. The photoresist material of claim 1 wherein the luminescent agent loading amount is less than the photoacid generator loading amount.

10. The photoresist material comprising:
a polymer
a photoacid generator configured to generate acid that reacts with the polymer;
a quencher base;
a chromophore;
a solvent; and
a luminescent agent that converts a first wavelength electromagnetic wave into a second wavelength electromagnetic wave, the second wavelength electromagnetic wave being capable of causing the photoacid generator to generate acid,
wherein the luminescent agent comprises a metal alloy represented by the formula McYd,
wherein M and Y are metals, and at least one of M or Y comprises sodium or potassium,
c is a number from about 0.1 to about 1, and
d is a number from about 0.8 to about 2, and the luminescent agent further comprises an ionic salt represented by the formula NaXb,
where N is a cation,
X is an anion,
a is a number from about 0.5 to about 1.5, and
b is a number from about 0.5 to about 3.

11. The photoresist material of claim 10 wherein M is selected from the group consisting of Na, K, Fe, Cu and Ni.

12. The photoresist material of claim 10 wherein Y is selected from the group consisting of Na, K, Fe, Cu and Ni.

13. The photoresist material of claim 10, wherein the luminescent agent further comprises an aromatic chemical represented by the formula:

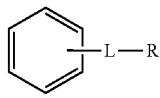

wherein L is a linking group, and R is selected from the group consisting of an alkyl group, an alkenyl group, an alkynyl group, an aromatic group, an epoxyl group, —Cl, —Br, —I, —NO$_2$, —H, —CN, —NCO, —OCN, —OH, —OR', —SR, —SO$_2$N(R')$_2$, —SO$_2$R', SOR', —OC(O)R', —C(O)OR', —C(O)R', —Si(OR')$_3$ and —Si(R')$_3$, where R' is selected from the group consisting of hydrogen, an alkyl group, an alkenyl group, and an alkynyl group.

14. A method comprising:
providing a substrate;
forming a first material layer over the substrate;
forming a second material layer over the first material layer, wherein the second material layer comprises a luminescent agent and a photoacid generator different from the luminescent agent, wherein the luminescent agent comprises:
(a) an ionic salt represented by the formula MaXb,
where M is a metal cation,
X is an anion,
a is a number from about 0.5 to about 1.5, and
b is a number from about 0.5 to about 3; and
(b) a metal alloy represented by the formula McYd,
wherein M and Y are metals, and at least one of M or Y comprises sodium or potassium,
c is a number from about 0.1 to about 1, and
d is a number from about 0.8 to about 2; and
exposing one or more portions of the second material layer to a radiation of a first wavelength, such that the luminescent agent absorbs at least a portion of the radiation of the first wavelength and emits a second radiation of different wavelength from that of the radiation of the first wavelength.

15. The method of claim 14 wherein forming the second material layer comprises selecting the luminescent agent from an aromatic chemical combined with the ionic salt and the metal alloy.

16. The method of claim 14 further comprising:
performing a post-exposure baking process on the second material layer; and developing the second material layer to form a pattern in the second material layer.

17. The method of claim 16 wherein developing the second material layer to form the pattern comprises utilizing a basic solution including tetramethylammonium hydroxide (TMAH).

18. The method of claim 14 wherein the first wavelength is substantially less than 250 nm.

19. The method of claim 14 wherein the first wavelength is less than 15 nm.

20. The photoresist material of claim 14, wherein the luminescent agent further comprises an aromatic chemical represented by the formula:

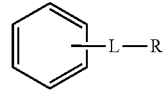

wherein L is a linking group, and R is selected from a group consisting of an alkyl group, an alkenyl group, an alkynyl group, an aromatic group, an epoxyl group, —Cl, —Br, —I, —NO$_2$, —SO$_3$—, —H—, —CN, —NCO, —OCN, —CO$_2$—, —OH, —OR', —OC(O)CR', —SR, —SO$_2$N(R')$_2$, —SO$_2$R', SOR', —OC(O)R', —C(O)OR', —C(O)R', —Si(OR')$_3$ and —Si(R')$_3$, where R' is selected from the group consisting of hydrogen, an alkyl group, an alkenyl group, and an alkynyl group.

* * * * *